United States Patent
Capps, Jr. et al.

(10) Patent No.: US 7,389,195 B2
(45) Date of Patent: Jun. 17, 2008

(54) UNIFORM POWER DENSITY ACROSS PROCESSOR CORES AT BURN-IN

(75) Inventors: Louis Bennie Capps, Jr., Georgetown, TX (US); Anand Haridass, Austin, TX (US); Ronald Edward Newhart, Essex Junction, VT (US); Michael Jay Shapiro, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 131 days.

(21) Appl. No.: 11/278,303

(22) Filed: Mar. 31, 2006

(65) Prior Publication Data

US 2007/0239386 A1    Oct. 11, 2007

(51) Int. Cl.
*G01R 31/00* (2006.01)
(52) U.S. Cl. .................................................. 702/118
(58) Field of Classification Search ................. 702/118
See application file for complete search history.

(56) References Cited

U.S. PATENT DOCUMENTS

| | | | |
|---|---|---|---|
| 5,923,097 A * | 7/1999 | Corriveau et al. ............ 307/29 |
| 7,268,570 B1 * | 9/2007 | Audet et al. ................. 324/760 |
| 2003/0143763 A1 * | 7/2003 | Mayberry ..................... 438/14 |
| 2007/0074011 A1 * | 3/2007 | Borkar et al. ............... 712/227 |
| 2007/0188186 A1 * | 8/2007 | Kiryu .......................... 326/10 |
| 2007/0226482 A1 * | 9/2007 | Borkar et al. ............... 713/100 |
| 2008/0012583 A1 * | 1/2008 | Audet et al. ................. 324/713 |

* cited by examiner

*Primary Examiner*—John E Barlow, Jr.
*Assistant Examiner*—Cindy H Khuu
(74) *Attorney, Agent, or Firm*—Duke W. Yee; Diana R. Gerhardt; Mari A. Stewart

(57) ABSTRACT

A computer implemented method, data processing system, and computer usable code are provided for burn-in testing of a multiprocessor. A process identifies a power management data set for a plurality of processor cores associated with the multiprocessor. The process selects one or more of the plurality of processor cores to form a selected set of processor cores based upon the power management data set. The process initiates a burn-in test across the selected set of processor cores. In response to a determination that all processor cores in the plurality of processor cores have not been selected, the process repeats the above selecting and initiating steps until all the processor cores have been selected.

9 Claims, 6 Drawing Sheets

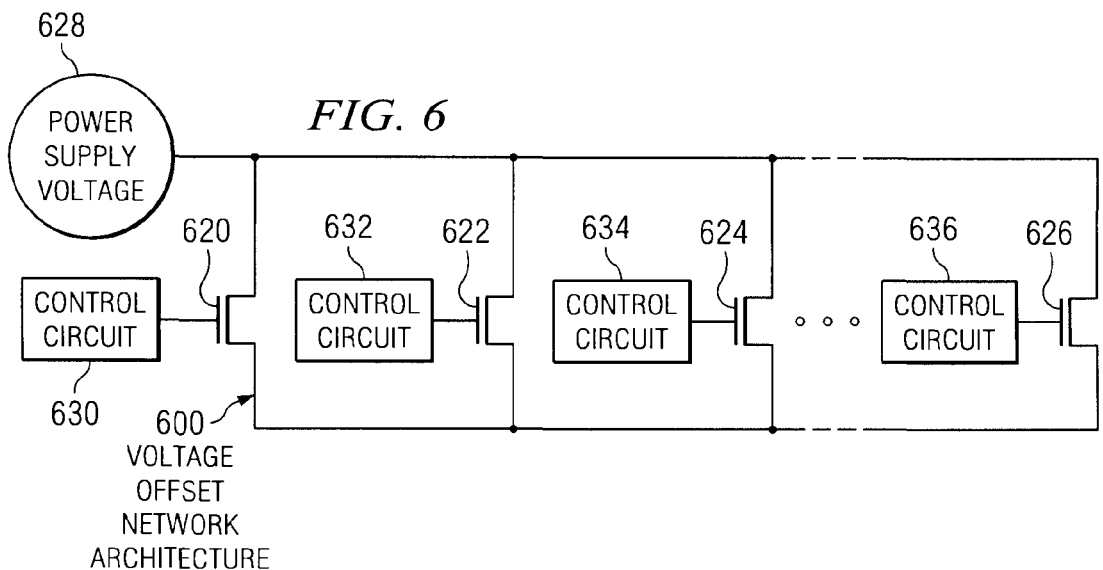
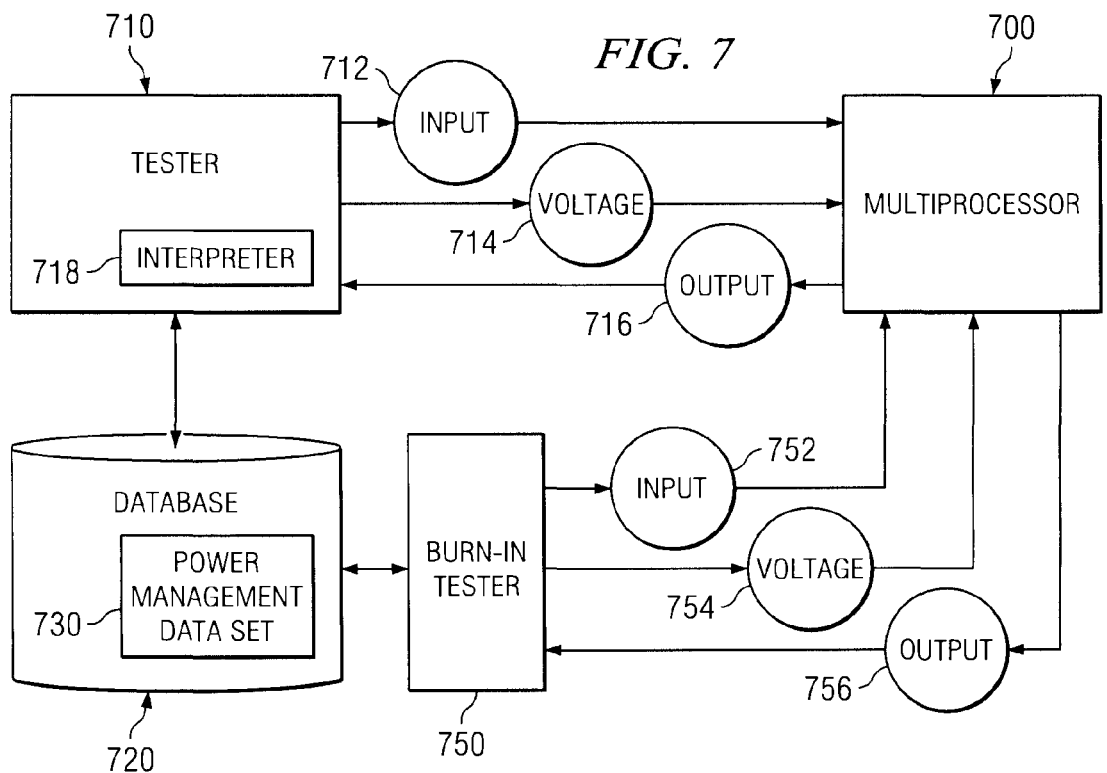

UNIFORM POWER DENSITY ACROSS PROCESSOR CORES AT BURN-IN

BACKGROUND

1. Field of the Invention

The present application relates generally to testing electronic circuits. More specifically, the present application relates to a computer implemented method, apparatus, and computer usable code for uniform power and thermal distribution across processor cores at burn-in.

2. Description of the Related Art

A multi-core microprocessor, referred to hereinafter as a "multiprocessor", is an integrated circuit (IC) having two or more independent processor cores. A processor core is an independent processor or computational unit capable of executing threads or other processes independently of the other processor core(s). The processor cores in a multiprocessor are typically plugged into a single processor socket, and share the same platform interface which connects each core to memory, input/output, and storage resources. This architecture permits enhanced performance, reduced power consumption, and simultaneous execution of multiple independent tasks or threads.

A multiprocessor may be considered to be functional for carrying out an intended purpose even if some functional units within the multiprocessor contain defects. For example, the first-generation Cell Broadband Engine™ (BE) processor, which is a heterogeneous, multi-core processor chip, is comprised of a single primary 64-bit Power PC® processor core (PPC) using a reduced instruction set computer (RISC) and eight synergistic processor cores (SPCs) using a single instruction multiple data (SIMD) instruction set. A heterogeneous multiprocessor has at least two cores that execute different instruction sets, respectively. On the other hand, a homogeneous multiprocessor has multiple cores that all use the same instruction set.

The Power PC® processor core is a general purpose central processing unit or primary processor. The synergistic processor cores are independent sub-processors capable of executing processes independently from the other synergistic processor cores. This modular chip is designed to operate without requiring all of the synergistic processor cores to function correctly.

If a defect is detected in a single functional unit of a multiprocessor, such as a synergistic processor core, the defective synergistic processor core can be disabled and the multiprocessor can still be used with the remaining functional unit(s). A multiprocessor in which one or more processing units are defective and one or more processing units remain functional is referred to herein as a "partial good" chip. As used herein, a processing unit is a processor core on a multiprocessor chip that performs processing functions. Examples of a processing unit include a primary processor, such as Power PC® processor core, or a sub-processor, such as a synergistic processor core.

Processor chips tend to experience a high rate of chip failure during the initial hours or days of the processor chip's operational life. This initially high fail rate drops off dramatically beyond the early mortality phase. This type of fail rate is referred to as a "bath-tub" fail rate. During the manufacture process of a processor chip, a burn-in test is generally performed at the factory in order to detect processor chips that are likely to experience a premature chip failure. The burn-in test simulates the first hours or days of a processor chip's operation by running a processor at a given voltage and/or temperature in order to accelerate the occurrence of early operational life failures. Thus, processor chips containing defects that would result in a premature failure of one or more processor cores in the multiprocessor can be identified.

A burn-in test accelerates early fails by operating the processor chip for a period of time at a particular voltage and/or temperature to ensure that all components are working properly before being released for sale. However, multiprocessors frequently require separate voltage planes for each processor core in order to optimize performance. In other words, each processing unit within a multiprocessor has different power requirements. A multiprocessor with a greater number of processor cores will require a greater number of voltage planes. A voltage plane refers to a voltage pin and circuitry that delivers power to a particular processor core.

An architect generally must add additional voltage pins to a multiprocessor as additional processor cores are added, in order to maintain separate voltage planes for each processor core. The additional voltage planes increase the complexity of the wiring required for each part of the chip. In addition, adding additional voltage planes can be expensive and cost prohibitive.

In the alternative, an architect can simply use one main voltage plane, such as a single pin, to deliver voltage to the multiprocessor. This option is less expensive. However, performance of the multiprocessor processor cores is suboptimized because different processor cores within a single multiprocessor chip may require a different voltage from the main voltage plane in order to perform at optimum speed.

SUMMARY

The different aspects of the illustrative embodiments provide a computer implemented method, apparatus, and computer usable code for burn-in testing of a multiprocessor. A process identifies a power management data set for a plurality of processor cores associated with the multiprocessor. The process selects one or more of the plurality of processor cores to form a selected set of processor cores based upon the power management data set. The process initiates a burn-in test across the selected set of processor cores. In response to a determination that all processor cores in the plurality of processor cores have not been selected, the process repeats the above selecting and initiating steps until all the processor cores have been selected.

BRIEF DESCRIPTION OF THE DRAWINGS

The novel features believed characteristic of the illustrative embodiments are set forth in the appended claims. The illustrative embodiments themselves, however, as well as a preferred mode of use, further objectives and advantages thereof, will best be understood by reference to the following detailed description of the illustrative embodiments when read in conjunction with the accompanying drawings, wherein:

FIG. 6 depicts a diagram of an on-chip power offset network architecture in a multiprocessor in which voltage is supplied to each processing unit by a separate voltage offset network in accordance with an illustrative embodiment;

FIG. 7 depicts a diagram of a dataflow when a multiprocessor chip is tested in accordance with an illustrative embodiment;

DETAILED DESCRIPTION OF THE PREFERRED EMBODIMENT

Figure 1:
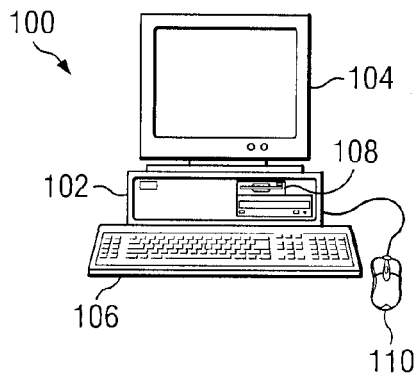
FIG. 1 depicts a pictorial representation of a network of data processing systems in which aspects of the illustrative embodiments may be implemented.

With reference now to the figures and in particular with reference to FIG. 1, a pictorial representation of a data processing system in which the aspects of the illustrative embodiments may be implemented. A computer 100 is depicted which includes system unit 102, video display terminal 104, keyboard 106, storage devices 108, which may include floppy drives and other types of permanent and removable storage media, and mouse 110. Additional input devices may be included with personal computer 100, such as, for example, a joystick, touchpad, touch screen, trackball, microphone, and the like. Computer 100 can be implemented using any suitable computer, such as an IBM eServer computer or IntelliStation computer, which are products of International Business Machines Corporation, located in Armonk, N.Y. Although the depicted representation shows a computer, other embodiments may be implemented in other types of data processing systems, such as a network computer. Computer 100 also preferably includes a graphical user interface (GUI) that may be implemented by means of systems software residing in computer readable media in operation within computer 100.

Figure 2:
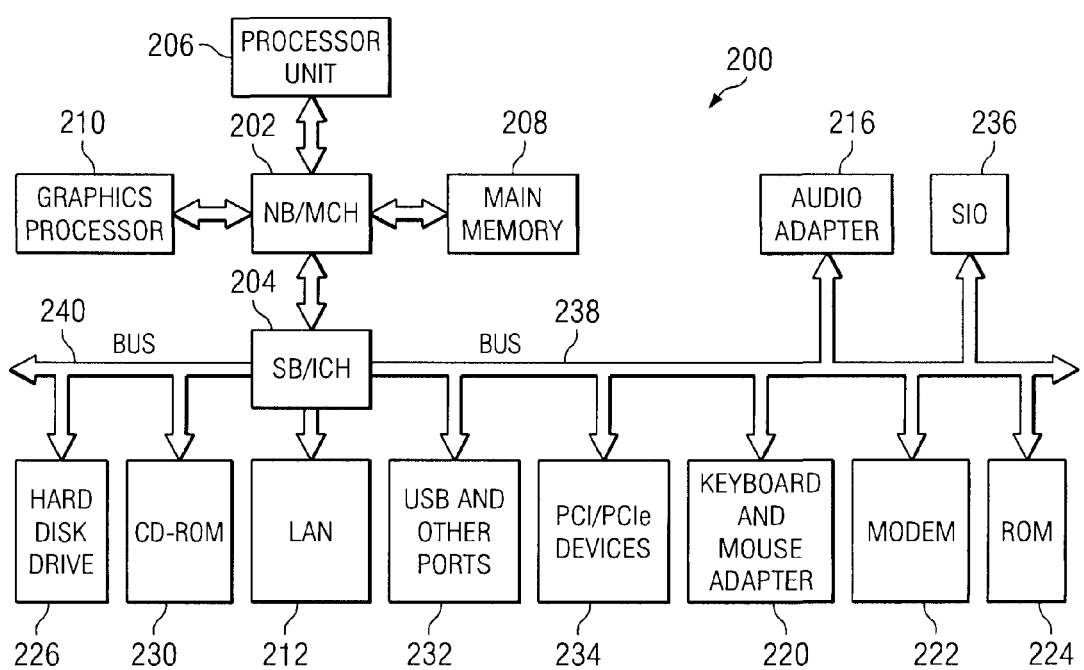
FIG. 2 depicts a block diagram of a data processing system in which aspects of the illustrative embodiments may be implemented.

With reference now to FIG. 2, a block diagram of a data processing system is shown in which aspects of the illustrative embodiments may be implemented. Data processing system 200 is an example of a computer, such as computer 100 in FIG. 1, in which code or instructions implementing the processes of the illustrative embodiments may be located. In the depicted example, data processing system 200 employs a hub architecture including a north bridge and memory controller hub (MCH) 202 and a south bridge and input/output (I/O) controller hub (ICH) 204. Processor unit 206, main memory 208, and graphics processor 210 are connected to north bridge and memory controller hub 202. Processor unit 206 contains a set of one or more processors. When more than one processors are present, these processors may be separate processors in separate packages. Alternatively, the processors may be multiple processor cores in a single package. Further, the processors may be multiple multi-core units. Graphics processor 210 may be connected to the MCH through an accelerated graphics port (AGP), for example.

In the depicted example, local area network (LAN) adapter 212 connects to south bridge and I/O controller hub 204 and audio adapter 216, keyboard and mouse adapter 220, modem 222, read only memory (ROM) 224, hard disk drive (HDD) 226, CD-ROM drive 230, universal serial bus (USB) ports and other communications ports 232, and PCI/PCIe devices 234 connect to south bridge and I/O controller hub 204 through bus 238 and bus 240. PCI/PCIe devices may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM drive 230 may use, for example, an integrated drive electronics (IDE) or serial advanced technology attachment (SATA) interface. A super I/O (SIO) device 236 may be connected to south bridge and I/O controller hub 204.

An operating system runs on processor unit 206 and coordinates and provides control of various components within data processing system 200 in FIG. 2. The operating system may be a commercially available operating system such as Microsoft® Windows® XP (Microsoft and Windows are trademarks of Microsoft Corporation in the United States, other countries, or both). An object oriented programming system, such as the Java™ programming system, may run in conjunction with the operating system and provides calls to the operating system from Java programs or applications executing on data processing system 200 (Java is a trademark of Sun Microsystems, Inc. in the United States, other countries, or both).

Instructions for the operating system, the object-oriented programming system, and applications or programs are located on storage devices, such as hard disk drive 226, and may be loaded into main memory 208 for execution by processor unit 206. The processes of the illustrative embodiments are performed by processor unit 206 using computer implemented instructions, which may be located in a memory such as, for example, main memory 208, read only memory 224, or in one or more peripheral devices.

Those of ordinary skill in the art will appreciate that the hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. Also, the processes of the illustrative embodiments may be applied to a multiprocessor data processing system.

In some illustrative examples, data processing system 200 may be a personal digital assistant (PDA), which is configured with flash memory to provide non-volatile memory for storing operating system files and/or user-generated data. A bus system may be comprised of one or more buses, such as a system bus, an I/O bus and a PCI bus. Of course the bus system may be implemented using any type of communications fabric or architecture that provides for a transfer of data between different components or devices attached to the fabric or architecture. A communications unit may include one or more devices used to transmit and receive data, such as a modem or a network adapter. A memory may be, for example, main memory 208 or a cache such as found in north bridge and memory controller hub 202. A processing unit may include one or more processors or CPUs. The depicted examples in FIGS. 1-2 and above-described examples are not meant to imply architectural limitations. For example, data processing system 200 also may be a tablet computer, laptop computer, or telephone device in addition to taking the form of a PDA.

Those of ordinary skill in the art will appreciate that the hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. Also, the processes of the embodiments may be applied to a multiprocessor data processing system.

In some illustrative examples, data processing system 200 may be a personal digital assistant (PDA), which is configured with flash memory to provide non-volatile memory for storing operating system files and/or user-generated data.

A bus system may be comprised of one or more buses, such as bus 238 or bus 240 as shown in FIG. 2. Of course, the bus system may be implemented using any type of communication fabric or architecture that provides for a transfer of data between different components or devices attached to the fabric or architecture. A communication unit may include one or more devices used to transmit and receive data, such as modem 222 or network adapter 212 of FIG. 2. A memory may be, for example, main memory 208, ROM 224, or a cache such as found in NB/MCH 202 in FIG. 2. The depicted examples in FIGS. 1-2 and above-described examples are not meant to imply architectural limitations. For example, data processing system 200 also may be a tablet computer, laptop computer, or telephone device in addition to taking the form of a PDA.

Figure 3:
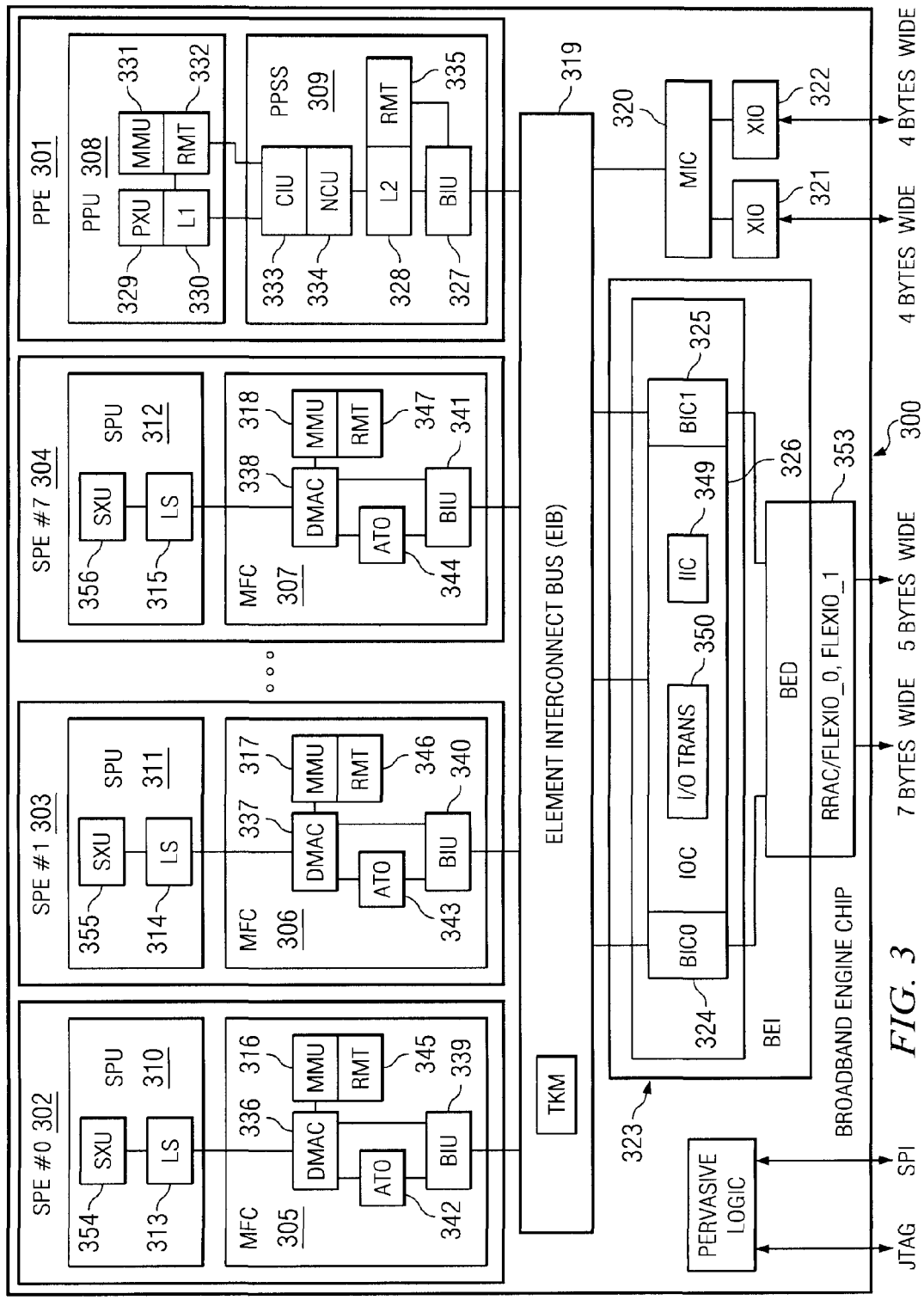
FIG. 3 depicts a diagram of a Cell Broadband Engine™ architecture-compliant multiprocessor in which aspects of the illustrative embodiments may be implemented.

FIG. 3 is a diagram of a Cell Broadband Engine™ chip in which aspects of the illustrative embodiments may be implemented in accordance with an illustrative embodiment. Cell Broadband Engine™ chip 300 is a single-chip, heterogeneous multiprocessor implementation directed toward distributed processing targeted for media-rich applications such as game consoles, desktop systems, and servers.

Cell Broadband Engine™ chip 300 may be logically separated into the following functional components: Power PC® processor element (PPE) 301 using a reduced instruction set computer (RISC) instruction set; and synergistic processor elements (SPE) 302, 303, and 304 comprising synergistic processor units (SPU) 310, 311, and 312 using a single instruction multiple data (SIMD) instruction set; and memory flow controllers (MFC) 305, 306, and 307. Although synergistic processor elements 302-304 and Power PC® processor element 301 are shown by example, any type of processor element may be supported. Exemplary Cell Broadband Engine™ chip 300 implementation includes one Power PC® processor element 301 and eight synergistic processor elements, although FIG. 3 shows only three synergistic processor elements (SPEs) 302, 303, and 304. The synergistic processor element (SPE) of a Cell Broadband Engine™ processor uses a SIMD processor architecture designed to accelerate media and data streaming workloads.

In these examples, each synergistic processor element includes one synergistic processor unit (SPU) 310, 311, or 312 with its own local store (LS) area 313, 314, or 315 and a dedicated memory flow controller (MFC) 305, 306, or 307 that has an associated memory management unit (MMU) 316, 317, or 318 to hold and process memory protection and access permission information. Once again, although synergistic processor units are shown by example, any type of processor unit in a multiprocessor may be supported. In addition, although Cell Broadband Engine™ chip 300 is a heterogeneous multiprocessor in these examples, the aspects of the illustrative embodiments can also be implemented with a non-heterogeneous multiprocessor, as well.

Cell Broadband Engine™ chip 300 implements element interconnect bus (EIB) 319 and other I/O structures to facilitate on-chip and external data flow. Element interconnect bus 319 serves as the primary on-chip bus for Power PC® processor element 301 and synergistic processor elements 302, 303, and 304. In addition, element interconnect bus 319 interfaces to other on-chip interface controllers that are dedicated to off-chip accesses. The on-chip interface controllers include the memory interface controller (MIC) 320, which provides two extreme data rate I/O (XIO) memory channels 321 and 322, and broadband engine interface (BEI) unit 323, which provides two high-speed external I/O channels and the internal interrupt control for the Cell Broadband Engine™ chip 300. The Cell Broadband Engine™ interface unit 323 is implemented as bus interface controllers (BIC0 & BIC1) 324 and 325 and I/O interface controller (IOC) 326. The two high-speed external I/O channels connected to a polarity of RRAC interfaces providing the flexible input and output (FlexIO_0 & FlexIO_1) 353 for the Cell Broadband Engine™ 300.

Each synergistic processor unit 310, 311, or 312 has a corresponding local store area 313, 314, or 315 and synergistic execution units (SXU) 354, 355, or 356. Each individual synergistic processor unit 310, 311, or 312 can execute instructions (including data load and store operations) only from within its associated local store area 313, 314, or 315. For this reason, all required data transfers to or from storage elsewhere in a system is performed using memory flow controller direct memory access operations via synergistic processor unit's 310, 311, and 312 dedicated memory flow controllers 305, 306, and 307.

A program running on synergistic processor unit 310, 311, or 312 only references its own local store area 313, 314, or 315 using a local store address. However, each synergistic processor unit's local store area 313, 314, or 315 is also assigned a real address (RA) within the overall system's memory map. This allows privileged software to map a local store area to the effective address (EA) of a process to facilitate direct memory access transfers between the local store of one synergistic processor unit and the local store of another synergistic processor unit. Power PC® processor element 301 may also directly access any synergistic processor unit's local store using an effective address.

The memory flow controller direct memory access data transfer commands always use one local store address and one effective address. The local store address directly addresses the local store memory of the associated synergistic processor unit 310, 311, or 312 corresponding to the memory flow controller command queues on which the direct memory access command request is placed. However, the effective address may be arranged to access any other memory storage area in the system, including local store areas 313, 314, and 315 of the other synergistic processor elements 302, 303, and 304.

Main storage is shared by Power PC® processor unit 308, the power processor element (PPE) 301, synergistic processor elements (SPEs) 302, 303, and 304, and I/O devices in a system. All information held in this level of storage is visible to all processors and devices in the system. Programs reference this level of storage using an effective address. Since the memory flow controller synergistic processor unit command queue, the memory flow controller proxy command queue, and the control and status facilities are mapped to the effective address space, it is possible for power processor element 301 to initiate direct memory access operations involving a local store area associated with any of synergistic processor elements (SPEs) 302, 303, and 304.

A synergistic processor unit program accesses main storage by generating and placing a direct memory access data transfer command, with the appropriate effective address and local store address, into its memory flow controllers (MFCs) 305, 306, or 307 command queue for execution. When executed, the required data are transferred between its own local store area and main storage. Memory flow controllers (MFCs) 305, 306, or 307 provide a second proxy command queue for commands generated by other devices such as the power processor element (PPE) 301. The proxy command queue is typically used to store a program in local storage prior to starting the synergic processor unit. Proxy commands can also be used for context store operations.

The effective address part of the data transfer is much more general, and can reference main storage, including all synergistic processor unit local store areas. These local store areas are mapped into the effective address space. The data transfers are protected. An effective address is translated to a real address through a memory management unit. The translation process allows for virtualization of system memory and memory protection.

Power PC® processor element 301 on Cell Broadband Engine™ chip 300 consists of 64-bit Power PC® processor unit 308 and Power PC® storage subsystem (PPSS) 309. Power PC® processor unit 308 contains processor execution unit (PXU) 329, level 1 (L1) cache 330, memory management unit (MMU) 331 and replacement management table (RMT) 332. Power PC® storage subsystem 309 consists of cacheable interface unit (CIU) 333, non-cacheable unit (NCU) 334, level 2 (L2) cache 328, replacement management table (RMT) 335 and bus interface unit (BIU) 327. Bus interface unit 327 connects Power PC® storage subsystem 309 to the element interconnect bus 319.

Synergistic processor unit 310, 311, or 312 and memory flow controllers (MFCs) 305, 306, and 307 communicate with each other through unidirectional channels that have capacity. The channel interface transports messages to and from memory flow controllers 305, 306, and 307, synergistic processor units 310, 311, and 312. Bus interface units 339, 340, and 341 connect memory flow controllers 305, 306, and 307 to element interconnect bus (EIB) 319.

Memory flow controllers 305, 306, and 307 provide two main functions for synergistic processor units 310, 311, and 312. Memory flow controllers 305, 306, and 307 move data between synergistic processor unit's 310, 311, or 312 local store (LS) area 313, 314, and 315 and main storage. Additionally, memory flow controllers 305, 306, and 307 provide synchronization facilities between synergistic processor units 310, 311, and 312 and other devices in the system.

Memory flow controllers 305, 306, and 307 implementation has four functional units: direct memory access controllers (DMAC) 336, 337, and 338, memory management units (MMU) 316, 317, and 318, atomic units (ATO) 342, 343, and 344, replacement management tables (RMT) 345, 346, and 347, and bus interface units (BIU) 339, 340, and 341. Direct memory access controllers 336, 337, and 338 maintains and processes memory flow controller command queues (MFC CMDQs), which consist of a memory flow controller synergistic processor unit command queue (MFC SPUQ) and a memory flow controller proxy command queue (MFC PrxyQ). The sixteen-entry, memory flow controller synergistic processor unit command queue handles memory flow controller commands coming from the synergistic processor unit channel interface. The eight-entry, memory flow controller proxy command queue processes memory flow controller commands coming from other devices through memory mapped input and output (MMIO) load and store operations. A typical direct memory access command moves data between the local store and the main storage. The main storage is addressed by the effective address direct memory access command operand. The local store is addressed by the local store address (LSA) direct memory access command operand.

In a virtual mode, memory management units 316, 317, and 318 provides the address translation and memory protection facilities to handle the effective address translation request from direct memory access controllers 336, 337, and 338 and send back the translated address. Each synergistic memory management unit maintains a segment lookaside buffer (SLB) and a translation lookaside buffer (TLB). The segment lookaside buffer translates an effective address to a virtual address (VA) and the translation lookaside buffer translates the virtual address coming out of the segment lookaside buffer to a real address.

Atomic units 342, 343, and 344 provide the level of data caching necessary for maintaining synchronization with other processing units in the system. Coherency with other caches in the system is maintained. Atomic direct memory access commands provide the means for the synergistic processor elements to request synchronization with other units.

The main function of bus interface units 339, 340, and 341 is to provide the synergistic processor elements 302, 303, and 304 with an interface to the element interconnect bus.

Element interconnect bus 319 provides a communication path between all of the processors on Cell Broadband Engine™ chip 300 and the external interface controllers attached to element interconnect bus 319.

Memory interface controller 320 provides an interface between element interconnect bus 319 and one or two of extreme data rate I/O cell memory channels 321 and 322. Extreme data rate (XDR™) dynamic random access memory (DRAM) is a high-speed, highly serial memory provided by Rambus. The extreme data rate dynamic random access memory is accessed using a macro provided by Rambus, referred to in this document as extreme data rate I/O cell memory channels 321 and 322.

Memory interface controller 320 is only a slave on element interconnect bus 319. Memory interface controller 320 acknowledges commands in its configured address range(s), corresponding to the memory in the supported hubs.

Bus interface controllers 324 and 325 manage data transfer on and off the chip from element interconnect bus 319 to either of two external devices. Bus interface controllers 324 and 325 may exchange non-coherent traffic with an I/O device, or it can extend element interconnect bus 319 to another device, which could even be another Cell Broadband Engine™ chip. When used to extend the element interconnect bus, coherency is maintained between caches in the Cell Broadband Engine™ and caches in the external device attached.

I/O interface controller 326 handles commands that originate in an I/O interface device and that are destined for the coherent element interconnect bus 319. An I/O interface device may be any device that attaches to an I/O interface such as an I/O bridge chip that attaches multiple I/O devices or another Cell Broadband Engine™ chip 300 that is accessed in a non-coherent manner. I/O interface controller 326 also intercepts access to element interconnect bus 319 that are destined to memory-mapped registers that reside in or behind an I/O bridge chip or non-coherent Cell Broadband Engine™ chip 300, and routes them to the proper I/O interface. I/O interface controller 326 also includes internal interrupt controller (IIC) 349 and I/O address translation unit (I/O Trans) 350.

As multiprocessors, such as the Cell Broadband Engine™ chip 300, become more complex, there are more opportunities for defects to arise during the manufacturing process that may impair or impede the proper or expected operation of the multiprocessor. Multiprocessor chips are tested during various stages of the multiprocessor chip manufacturing process to identify defective functional units within a given multiprocessor in order to determine if a given chip is a wholly good chip, partial good chip, or wholly defective chip that is not salvageable for the chips intended purpose.

Multiprocessor chips frequently require separate voltage planes for each processor core in order to optimize the performance of each processor core. For example, Power PC® processor unit 308 may require a different voltage for optimal performance than one or more of the synergistic processor cores due to design differences between different processor core types. The aspects of the illustrative embodiments recognize the need to balance the power and thermal distribution across processor cores at burn-in in order to provide for increased energy efficiency and optimized testing. Therefore, the illustrative embodiments select a set of processing units according to which processing units would provide a more uniform power and performance distribution across the multiprocessor chip site during burn-in. In this manner, the aspects of the illustrative embodiments provide a computer implemented method, apparatus, and computer usable code for uniform power and thermal distribution across processor cores at burn-in.

The different aspects of the illustrative embodiments provide a computer implemented method, apparatus, and computer usable code for burn-in testing of a multiprocessor. A process identifies a power management data set for a plurality of processor cores associated with the multiprocessor. The process selects one or more of the plurality of processor cores to form a selected set of processor cores based upon the power management data set. The process initiates a burn-in test across the selected set of processor cores that results in more uniform distribution of power between processor cores that meets system reliability specifications. In response to a determination that all processor cores in the plurality of processor cores have not been selected, the process repeats the above selecting and initiating steps until all the processor cores have been selected. As used herein, the term "set of processor cores" includes a single processor core, as well as two or more processor cores.

Figure 4:
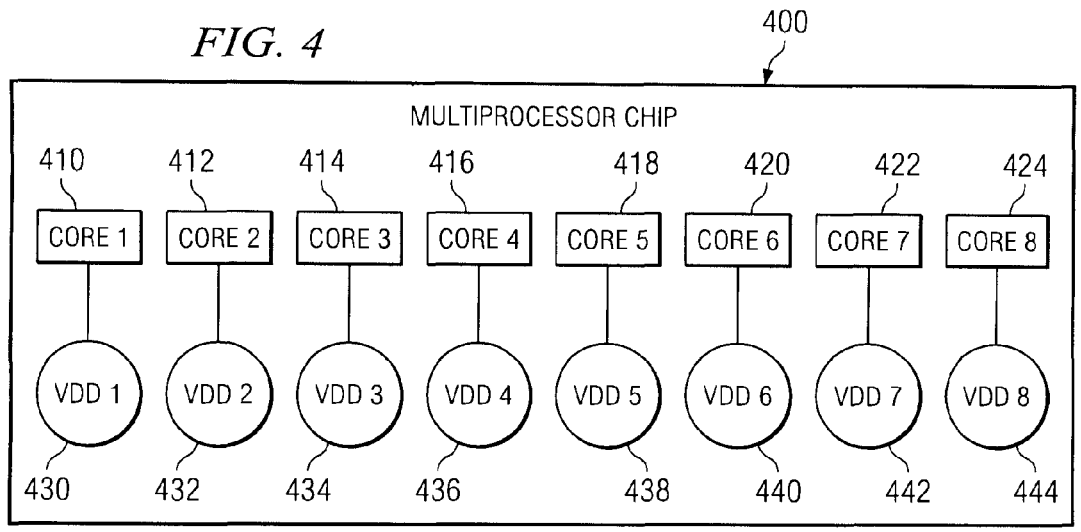
FIG. 4 depicts a diagram of a Cell Broadband Engine™ architecture-compliant multiprocessor in which voltage is supplied to each processing unit by a separate voltage pin in accordance with an illustrative embodiment.

FIG. 4 is a diagram of a Cell Broadband Engine™ architecture-compliant multiprocessor in which voltage is supplied to each processing unit by a separate voltage pin in accordance with an illustrative embodiment. Multiprocessor chip 400 is a multiprocessor such as Cell Broadband Engine™ chip 300 in FIG. 3. Cores 410-424 are processor cores such as processing units 308-312 in FIG. 3.

A unique voltage pin, such as voltage pins 430-444, is associated with a processor core, such as processor cores 410-424 in multiprocessor chip 400. Each core 410-424 can be powered or shut down via the voltage applied at the corresponding voltage pin on the module for multiprocessor 400, such as voltage pins 433-444.

Each voltage pin provides voltage to its corresponding processor core independently of the other voltage pins. For example, voltage pin 432 receives a voltage from an external source and provides the voltage to processor core 412 through a direct contact between voltage pin 432 and processor core 412. Voltage pin 432 associated with processor core 412 only provides power to processor core 412. Thus, processor core 412 can be receiving power through voltage pin 432 while, simultaneously, processor core 410 is shut down, receiving no power from voltage pin 430, or receiving a different voltage from voltage pin 430. In this manner, a different voltage can be supplied to each processor core. Each time another processor core is added to multiprocessor chip 400 during the manufacture process, a new voltage pin is added to deliver power to the new processor core.

In accordance with the aspects of the illustrative embodiments, a set of processor cores are selected and isolated by only providing voltage through a set of voltage pins associated with the set of processor cores. Thus, any processor cores that are not included in the selected set of processor cores remain dormant or shut off due to the lack of voltage to those unselected processor cores. In addition, a different voltage can be applied to each voltage pin in the set of voltage pins associated with the selected set of processor cores. Thus, this illustrative embodiment permits a different voltage to be applied to different sets of processor cores during one or more burn-in tests.

In an alternative embodiment, a voltage is applied to a multiprocessor chip through a single voltage pin for the entire multiprocessor. In such a case, voltage to each processor core cannot be regulated or controlled by means of the voltage pin. Therefore, the illustrative embodiments provide an on-chip network and gating system logic to control voltage to a set of processor cores.

Figure 5:
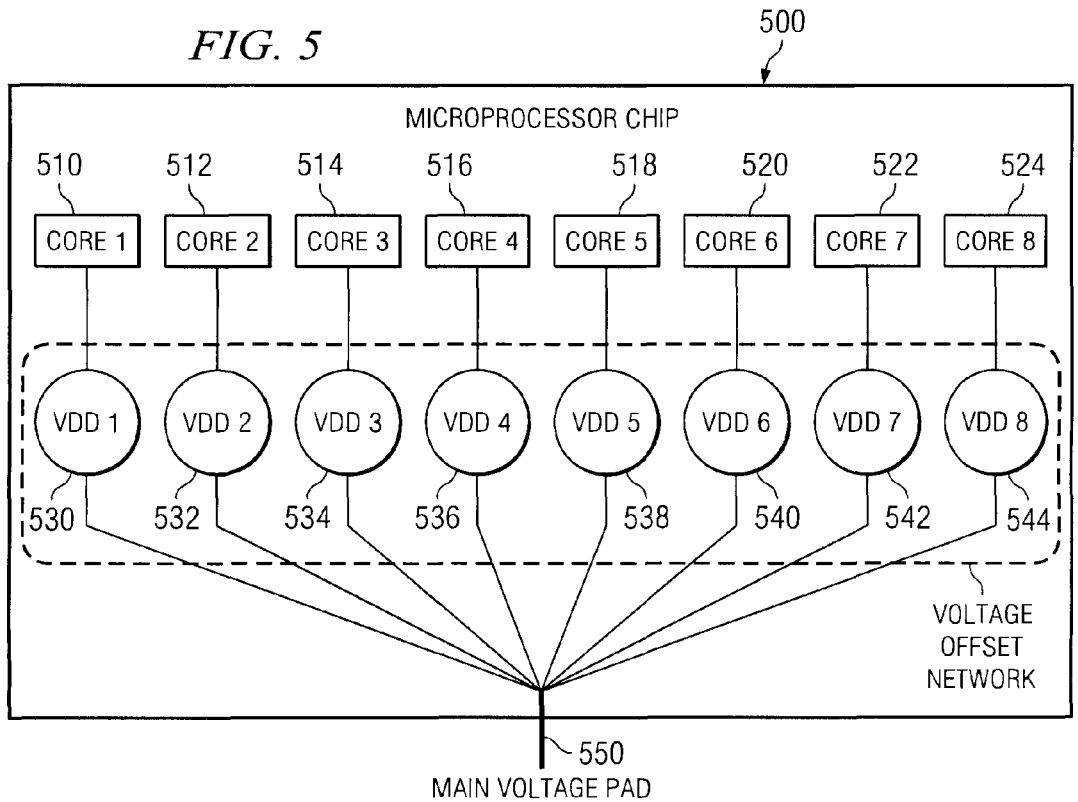
FIG. 5 depicts a diagram of a network and gating system associated with a Cell Broadband Engine™ architecture-compliant multiprocessor in which voltage is supplied to each processing unit by a separate voltage offset network in accordance with an illustrative embodiment.

FIG. 5 is a diagram of a network and gating system associated with a Cell Broadband Engine™ architecture-compliant multiprocessor in which voltage is supplied to each processing unit by a separate voltage offset network in accordance with an illustrative embodiment. Multiprocessor chip 500 is a multiprocessor such as Cell Broadband Engine™ chip 300 in FIG. 3. Cores 510-524 are processor cores such as processing units 308-312 in FIG. 3.

An on-chip voltage regulator controls the voltage provided to each processor core on multiprocessor 500. Each processor core receives power from a voltage offset network connected to each core, such as voltage offset networks 530-544. Each of voltage offset networks 530-544 controls the voltage applied to a corresponding processor core. For example, voltage offset network 530 controls the voltage applied to processor core 510 but does not have any control over a voltage applied to processor cores 512-524. Thus, rather than controlling voltage through separate voltage pins, voltage is controlled through a logic internal to the chip which controls which core receives a particular voltage.

Each of voltage offset networks receives voltage from an external source through a single voltage pin, such as voltage pin 550. Thus, all voltage to multiprocessor 500 is provided through voltage pin 550. Voltage offset networks 530-544 then control and regulate the voltage to processor cores 510-524. In this manner, a uniform power density can be applied across diverse processor cores in a single multiprocessor in order to optimize processor performance at burn-in.

FIG. 6 is a diagram of on-chip power offset network architecture in a multiprocessor in which voltage is supplied to each processing unit by a separate voltage offset network in accordance with an illustrative embodiment. Voltage offset network architecture 600 is a voltage regulator for controlling a voltage applied to a corresponding processor core, such as voltage offset networks 530-544 in FIG. 5. Transistors 620-626 are electronic devices used to control the flow of electricity in integrated circuits, such as multiprocessor 500 in FIG. 5. Parallel transistors 620-626 consist of a small block semiconductor with three electrical contacts. In this illustrative embodiment, power supply voltage 628 is dropped by parallel transistors 620-626. Power supply voltage 628 is a voltage provided to a multiprocessor during a burn-in test. The amount of voltage for power supply voltage 628 is adjusted to a higher voltage or a lower voltage depending upon the power management data for each processor core in a set of processor cores being tested during a burn-in test.

Each transistor is switched by a corresponding control circuit, such as control circuits 630-636, in order to control the voltage supplied to the corresponding processor core. The net voltage supplied to a processor core can be adjusted to a higher voltage or a lower voltage by controlling the number of transistors that are switched on. In accordance with an illustrative embodiment, a transistor amplifies a voltage as the voltage passes through the transistor. Thus, the greater the number of transistors that are switched on by a control circuit, the greater the voltage that is supplied to a corresponding processor core.

Control circuits 630-636 execute logic to determine whether to switch a transistor associated with the control circuit to increase or decrease the amount of voltage to the corresponding processor core, as well as how much voltage to supply to the processor core. Thus, a network and gating system can control and/or adjust the amount of voltage provided to each processor core in a selected set of processor cores being tested during a burn-in test.

FIG. 7 is a diagram of a dataflow when a multiprocessor chip is tested in accordance with an illustrative embodiment. Multiprocessor 700 is a multiprocessor chip such as Cell Broadband Engine™ chip 300 in FIG. 3. Tester 710 performs a wafer test on multiprocessor in order to identify a power management data set for each processor core associated with multiprocessor 700. Tester 710 provides input 712 to multiprocessor 700. Input 712 is an input scan chain test pattern that causes multiprocessor 700 to perform one or more operations or processes during a wafer test process. Tester 710 provides a power voltage, such as voltage 714, to multiprocessor 700 by means of at least one voltage pin. Multiprocessor 700 generates output 716 in response to receiving input 712 and voltage 714.

Interpreter 718 receives output 716 from multiprocessor 700. Interpreter 718 analyzes and interprets output 716 to determine a set of power management data for each processor core. Power management data is a data set of power/ thermal factors for each processor core in multiprocessor 700 and/or burn-in tester 750. Power management data set 730 contains information including, but not limited to, power usage data for each processor core associated with multiprocessor 700, an execution speed for each processor core associated with multiprocessor 700, a thermal capacity and/or thermal limit of each processor core associated with multiprocessor 700, and a thermal limit of burn-in tester 750. Power usage data for a processor core includes, but is not limited to, at least one of a standby power usage of the processor core, an active/operational power usage of the processor core, a maximum voltage for the processor core, and an optimal voltage for the processor core. An execution speed is a speed for how fast a processor core executes a single instruction. Thus, tester 710 identifies power management data for multiprocessor 700 by performing a wafer test. The wafer test determines a power usage data for each processor core, a thermal capacity and/or thermal limit for each processor core, and an execution speed for each processor core to form power management data set 730.

In this illustrative example, power management data set 730 contains different power management data for each processor core due to design differences and/or variations in each processor core that occur during manufacture. For example, a primary processor core, such as Power PC® processor, may operate at a faster speed and require a higher voltage than a sub-processor, such as a synergistic processor unit, due to purely design and architectural differences between the processor cores. Likewise, one synergistic processor core may have a different set of power measurements than another synergistic processor core of the same/ similar design due to variations that occur during the manufacture of each core. Such variations could result in one processor core operating less efficiently than another processor core that has the same design and architecture.

Thus, a given processor core's power management data in data set 730 is influenced by the given processor core's design and/or variations in the given processor core that occur during manufacture. Therefore, tester 710 tests each processor core in the plurality of processor cores associated with multiprocessor 700 in order to determine the power management data for each processor core. Tester 710 stores the power management data for each processor core in database 720 as power management data set 730.

Burn-in tester 750 selects a set of processor cores from the plurality of processor cores associated with multiprocessor 700. In accordance with the illustrative embodiments, a selected set of processor cores can include any number of processor cores selected from a plurality of processor cores associated with a given multiprocessor, such as multiprocessor 700.

Burn-in tester 750 selects the particular processor cores from the plurality of processor cores for the selected set of processor cores based on power management data for each processor core stored in power management data set 730. Burn-in tester 750 analyzes the power management data set 730 to determine a power usage and thermal capacity for each processor core. Burn-in tester 750 identifies two or more processor cores to form a set of processor cores based on an average power usage and an average thermal capacity for the set of processor cores. The set of processor cores is selected based on an average power usage and/or the average thermal capacity for the set of processor cores in order to provide an improved uniform distribution of power usage and/or thermal capacity during the burn-in testing.

In accordance with an illustrative embodiment, burn-in tester 750 also selects the number of processor cores in the selected set of processor cores. The number of processor cores in the set of processor cores is selected based on power management data for each processor core and/or power management data for burn-in tester 750.

In accordance with another illustrative embodiment, a user selects the number of processor cores in each selected set of processor cores to form a user selected number of processor cores. In an alternative embodiment, a selected set of processor cores contains a default number of processor cores.

For example, if multiprocessor 700 has eight processor cores with four of the processor cores running ten percent slow and four of the processor cores running ten percent fast, burn-in tester 750 could select two of the processor cores that are running slow and two of the processor cores that are running fast in order to balance out the total power usage by the set of processor cores during a burn-in test based on the power consumption data for each processor core and the maximum power capacity of burn-in tester 750.

Burn-in tester 750 initiates a burn-in test on the selected set of processor cores. Burn-in tester 750 selects a first set of processor cores from a plurality of processor cores associated with multiprocessor 700 based upon the power management data in order to provide the most uniform power and thermal distribution across the multiprocessor chip during burn-in.

A burn-in test is performed on the selected set of processor cores during burn-in for a given amount of time, referred to as a burn-in time. A burn-in time is the amount of time a voltage is run through a set of processor cores during a burn-in test. The burn-in time is adjusted by burn-in tester 750 based on the power management data for each processor core in the set of processor cores and power management data for burn-in tester 750 itself, in order to create a uniform thermal and power distribution across the set of processor cores during burn-in.

Burn-in tester provides input 752 and voltage 754 to multiprocessor 700 for a given burn-in time to identify any defective processor cores in the selected set of processor cores. In accordance with this illustrative embodiment, voltage is provided to the processor cores in the first set of processor cores by a single voltage pin. The voltage from the voltage pin is regulated and controlled by a voltage offset network associated with each processor core in the plurality of processor cores, as is shown in FIG. 5. The voltage offset networks for the processor cores in the first set of processor cores allows voltage to flow to the set of processor cores. The voltage offset networks associated with the processor cores that are not in the first set of processor cores do not permit voltage to flow to their associated processor cores. Thus, the voltage offset network gating mechanism controls the voltage to the processor cores such that the cores in the selected set of processor cores receive power and the cores that are not in the selected set of processor cores are dormant or inactive due to the absence of voltage available to those cores. In this manner, one or more processor cores in the set of processor cores are isolated form the plurality of processor cores for burn-in testing. In addition, burn-in tester 750 can balance and/or adjust a net power usage by the processor cores in a selected set of processor cores during a burn-in test process.

In accordance with another illustrative embodiment, a voltage is provided to each processor core in the selected set of processor cores through a different voltage pin associated with each processor core, as is shown in FIG. 4. The processor cores that are not included in the selected set of processor cores do not receive any voltage through their associated voltage pins.

After the first set of processor cores are tested, burn-in tester 750 determines if any processor cores have not been burn-in tested. If any processor cores have not been burn-in tested, burn-in tester selects a second set of processor cores based upon the power management data in power management data set 730. Burn-in tester 750 sends input 752 and voltage 754 to multiprocessor 700 to initiate burn-in testing of the second set of processor cores. Multiprocessor 700 sends output 756 to burn-in tester 750. Output 756 is analyzed by burn-in tester to determine whether each processor core in a set of processor cores are functional. A processor core is functional if it generates an expected output.

An expected output is an output that falls within an expected range of output results or output values generated by processor cores that are known to be functional, receiving the same and/or similar input, and operating under the same and/or similar conditions as the burn-in test conditions. In this manner, burn-in tester can determine whether a given processor core is operating in an expected and/or normal manner for a functional processor core. In accordance with an illustrative embodiment, if output 756 generated by a given processor core during a burn-in test is not within an expected range for functional processor cores, the given processor core is not a functional processor core.

Burn-in tester 750 determines whether all processor cores associated with multiprocessor 700 have received the minimum burn-in time and voltage/temperature stress conditions required for the burn-in testing process. If all of the processor cores have not been burn-in tested, burn-in tester selects a next set of processor cores for burn-in testing. This iterative process of selecting a set of processor cores, burn-in testing the set of cores, receiving results of the burn-in test, determining whether all processor cores associated with a given multiprocessor chip have been burn-in tested, and selecting a next set of processor cores if all of the processor cores have not been burn-in tested, continues until the burn-in tester determines that all processor cores have been tested.

Figure 8:
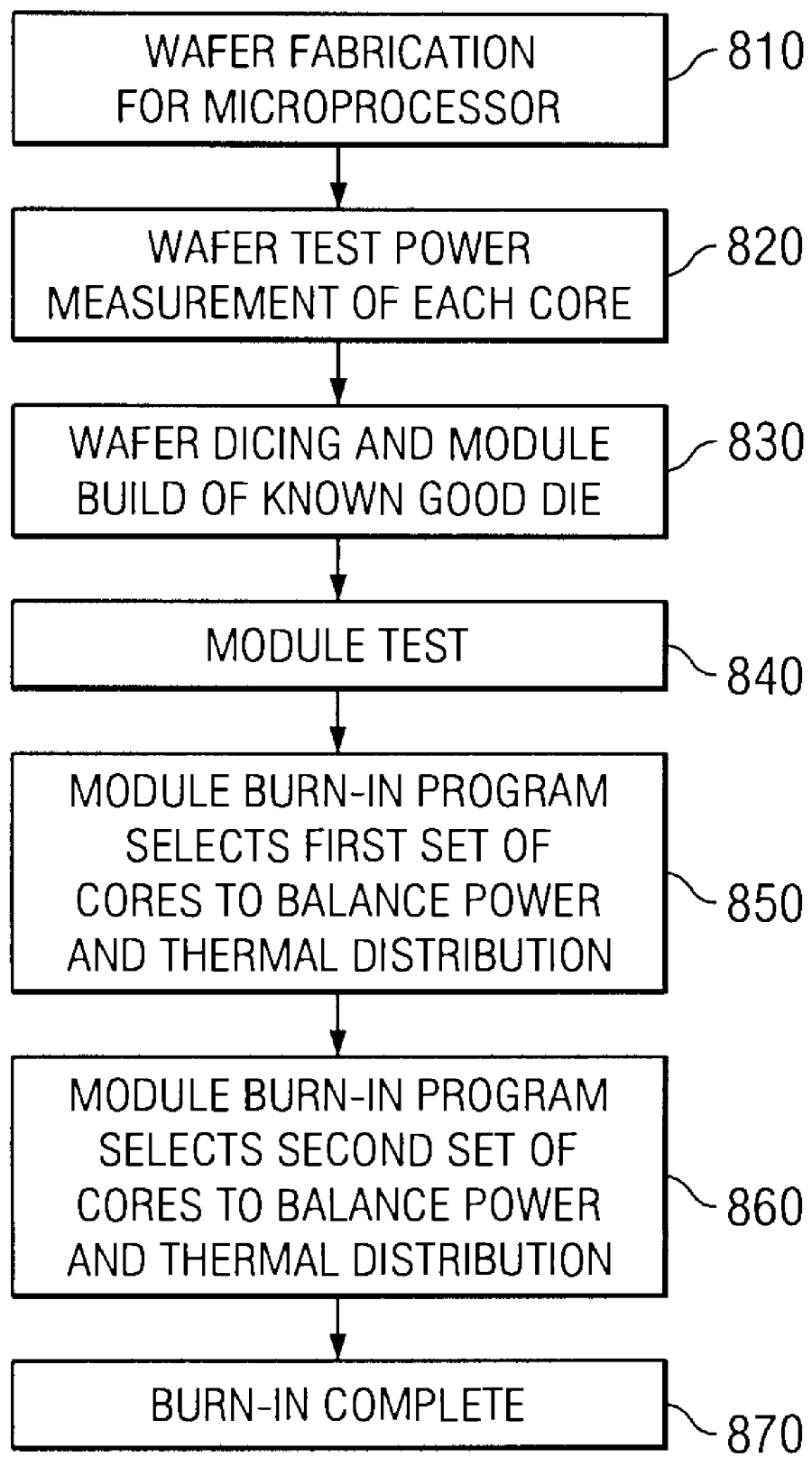
FIG. 8 depicts a flowchart of the steps involved in the manufacture and testing of a multiprocessor in accordance with an illustrative embodiment.

FIG. 8 depicts an illustrative flowchart of the steps involved in the manufacture and testing of a multiprocessor in accordance with an illustrative embodiment. At the conclusion of a wafer fabrication process for a multiprocessor (step 810), a final wafer fabrication tester, such as tester 710 in FIG. 7, tests the multiprocessor to determine a power measurement for each processor core associated with the multiprocessor (step 820). At this step in the chip manufacture process, the multiprocessor is located on a wafer along with a plurality of other multiprocessors. A wafer is a thin silicon disk upon which multiprocessor circuitry is laid in order to form the components of one or more multiprocessor chips. The power measurement for each processor core is utilized to determine the power management data for each processor core.

In the next step, each multiprocessor chip, referred to as a "die," is cut from the wafer during a process referred to as wafer dicing. After the wafer is diced, each good die is built into a module (step 830). The die is mounted on a laminate substrate to form a module. The process in step 830 is performed by die packaging tools during the manufacture process.

Next, the module is tested (step 840). The module test can be performed by tester 710 in FIG. 7. A burn-in tester, such as burn-in tester 750 in FIG. 7, performs a burn-in test of all module parts to reduce early life fails. The burn-in test utilizes the wafer power management data for each processor core. The burn-in tester selects a first set of processor cores to balance the power and thermal distribution across the processor cores (step 850). The burn-in tester will select a number of processor cores for the first set of processor cores based upon power management data for each processor core.

The burn-in tester selects a second set of processor cores based upon the power management data for each processor core in order to provide the most uniform power and thermal distribution across the module (step 860). The second set of processor cores does not contain any processor cores that were included in the first set of processor cores. In accordance with this illustrative embodiment, the burn-in tester will continue to select sets of processor cores for burn-in testing until all processor cores have been tested for the minimum burn-in time and the minimum voltage/temperature stress conditions by the burn-in tester process.

When burn-in testing is complete (step 870) and all modules have been tested, the burn-in process determines which modules are good modules. As used herein, a good module refers to a module that performs within operational expectations based on module test results. Module test results that are within an expected range of test results indicate that a module is performing within operational expectations. An expected range of test results is a range of test results generated by modules that are known to be functional and operating under the same or similar conditions as the module test conditions. The good modules can be subjected to additional tests, as necessary to ensure that the module is a wholly good or partially good module. After all additional testing is complete, the good modules are shipped to customers as wholly good or partial good multiprocessor chips.

In accordance with an illustrative embodiment, voltage to each processor core is controlled by a separate voltage pin associated with each processor core on a multiprocessor, as shown in FIG. 4. In such a case, each voltage pin associated with a processor core in a selected set of processor cores forms a set of voltage pins. A burn-in tester initiates a burn-in test across the selected set of processor cores by applying a first voltage across one or more voltage pins in the set of voltage pins. If the burn-in tester determines that a second voltage that is different from the first voltage should be applied to one or more processor cores in the set of processor cores, the burn-in tester also applies the second voltage to the one or more processor cores. In other words, the burn-in tester can apply a different voltage to each voltage in the set of voltage pins.

Thus, if a burn-in tester determines that three different voltages should be applied to three different processor cores in the selected set of processor cores, the burn-in tester will apply each different voltage to the voltage pin associated with each different processor core one or more voltage pin in the set of voltage pins during a burn-in test. In this manner, a burn-in tester can apply a different voltage to each voltage pin in the set of voltage pins to control the voltage applied to each processor core.

In the alternative embodiment, a voltage can be controlled by means of a network and gating system in which voltage to all processor cores is provided through a single voltage pin, as shown in FIG. 5. In such a case, the voltage to each processor core is controlled and/or modulated by an on-chip voltage offset network associated with each processor core.

Figure 9:
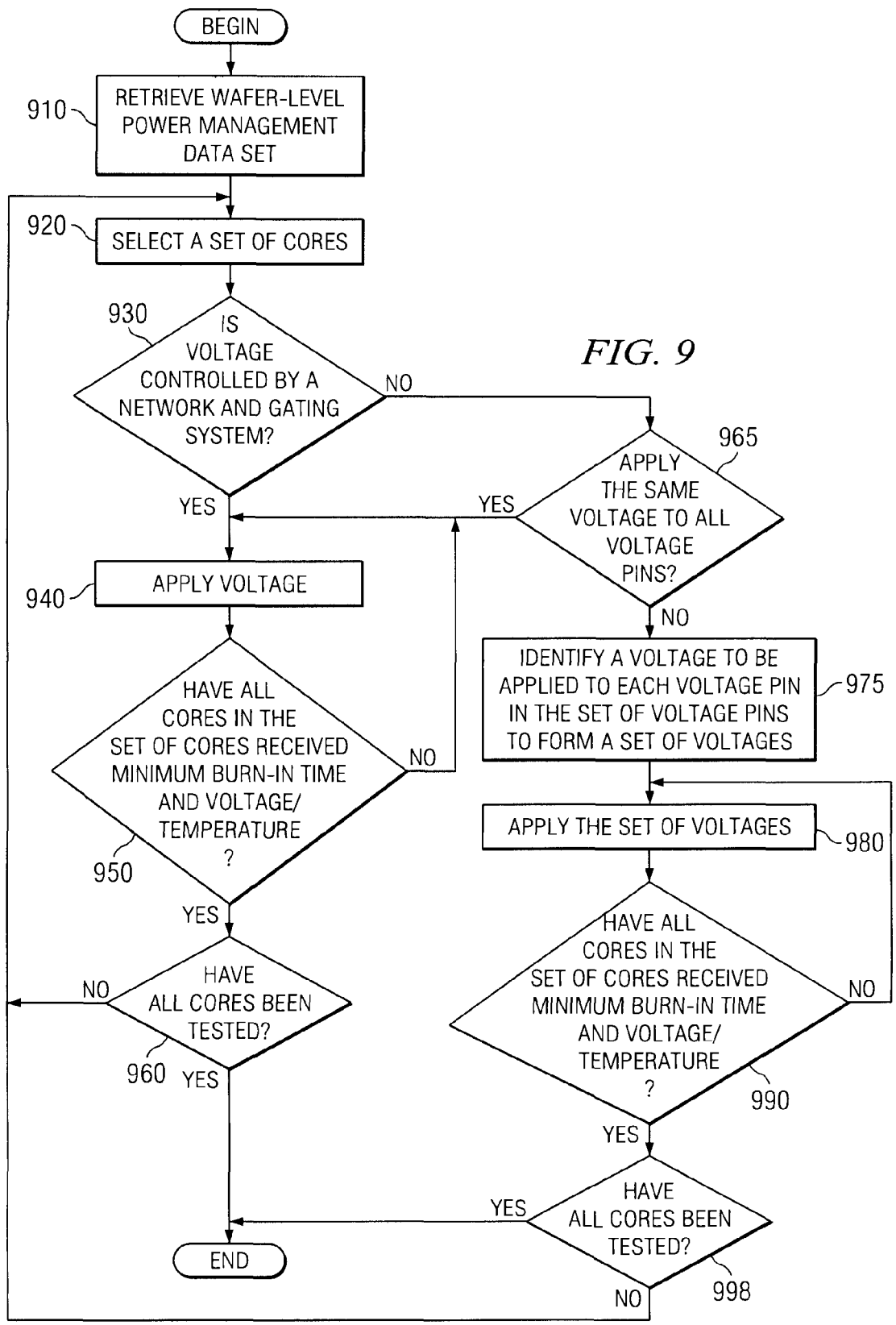
FIG. 9 depicts a flowchart of the process of performing a burn-in test in accordance with an illustrative embodiment.

FIG. 9 depicts an illustrative flowchart of the process of performing a burn-in test in accordance with an illustrative embodiment. FIG. 9 is a more detailed description of steps 850 and 860 in FIG. 8. The process is implemented by a burn-in tester, such as burn-in tester 750 in FIG. 7.

The process begins by retrieving a wafer-level power management data set for each processor core in a plurality of processor cores associated with a multiprocessor (step 910). The process then selects a set of processor cores based upon the power management data set (step 920). The process determines if voltage to the set of processor cores is controlled by a network and gating system (step 930). If the process determines that voltage is controlled by a network and gating system, the process applies a single voltage (step 940) to the multiprocessor. In such a case, the network and gating system adjusts and/or controls the voltage applied to each processor core in the set of processor cores.

The process next determines if all processor cores in the set of processor cores have received the minimum burn-in time, voltage and/or temperature required for burn-in testing (step 950). If the process determines that all of the processor cores in the set of processor cores have not received the minimum burn-in time, voltage and/or temperature required for burn-in testing, the process returns to step 940 until all processor cores in the set of processor cores have received the minimum burn-in time, voltage and/or temperature.

The process next determines if all the processor cores in the plurality of processor cores associated with the multiprocessor have been tested (step 960). If the process determines that all the processor cores have been tested, the process terminates thereafter.

Returning now to step 960, if all the processor cores have not been tested, the process returns to step 920 where the process selects a next set of processor cores. Steps 920 to 960 are repeated until the process determines that all processor cores in the plurality of processor cores have been tested. The process terminates thereafter.

Returning now to step 930, if the process determines that voltage is not controlled by a network and gating system, the process determines if the same voltage should be applied to all voltage pins in the set of voltage pins (step 965). If the same voltage should be applied to all voltage pins in the set of voltage pins, the process applies a single voltage (step 940) to all voltage pins in the set of voltage pins associated with the selected set of processor cores.

The process then determines if all processor cores in the set of processor cores have received the minimum burn-in time and voltage/temperature required for burn-in testing (step 950). If all the processor cores have not received the appropriate voltage for the minimum burn-in time, the process returns to step 940 until all processor cores in the set of processor cores have received the minimum burn-in time, voltage and/or temperature.

The process then determines if all the processor cores in the plurality of processor cores associated with the multiprocessor have been tested (step 960). If the process determines that all the processor cores have been tested, the process terminates thereafter. However, if the process determines that all the processor cores have not been tested, the process returns to step 920 where the process selects a next set of processor cores. Steps 920 to 965 are repeated until the process determines that all processor cores in the plurality of processor cores have been tested. The process terminates thereafter.

Returning now to step 965, if the process determines that the same voltage should not be applied to all the voltage pins in the set of voltage pins associated with the selected set of processor cores, the process identifies a specified voltage to be applied to each voltage pin in the set of voltage pins corresponding to the selected set of processor cores to form a set of voltages (step 975).

The process applies the identified set of voltages (step 980) to the set of voltage pins, such that each voltage pin can receive a different voltage. The process then determines if all processor cores in the set of processor cores have received the minimum burn-in time and voltage/temperature required for burn-in testing (step 990). If all the processor cores have not received the appropriate voltage for the minimum burn-in time, the process returns to step 980 until all processor cores in the set of processor cores have received the minimum burn-in time, voltage and/or temperature.

The process then determines if all the processor cores in the plurality of processor cores associated with the multiprocessor have been tested (step 998). If the process determines that all the processor cores have been tested, the process terminates thereafter. However, if the process determines that all the processor cores have not been tested, the process returns to step 920 where the process selects a next set of processor cores. Steps 920 to 998 are repeated until the process determines that all processor cores in the plurality of processor cores have been tested. The process terminates thereafter.

The aspects of the illustrative embodiments provide an improved computer implemented method, apparatus, and computer usable program code for burn-in testing of a multiprocessor. The process selects a set of processor cores from a plurality of processor cores on a multiprocessor chip for burn-in testing. The set of processor cores are selected based on power management data for each processor core. The voltage applied to a multiprocessor chip during a burn-in test is gated such that only the processor cores in the set of processor cores receive a voltage. In addition, the gating mechanism regulates the voltage applied to each processor core during burn-in. Thus, the aspects of the illustrative embodiments permit uniform power density across processor cores during burn-in testing to increase the power efficiency and optimization of burn-in testing without requiring additional voltage planes on a multiprocessor chip.

The flowchart and block diagrams in the figures illustrate the architecture, functionality, and operation of possible implementations of methods, apparatus, and computer program products according to various embodiments. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems which perform the specified functions or acts, or combinations of special purpose hardware and computer instructions.

Although specific examples of how the different components may be implemented have been provided, these examples are not meant to limit the architecture in which the aspects of the illustrative embodiments may be used. The aspects of the illustrative embodiments may be used with any multi-core processor system.

The illustrative embodiments can take the form of an entirely hardware embodiment, an entirely software embodiment or an embodiment containing both hardware and software elements. The illustrative embodiments are implemented in software, which includes but is not limited to firmware, resident software, microcode, etc.

Furthermore, the illustrative embodiments can take the form of a computer program product accessible from a computer-usable or computer-readable medium providing program code for use by or in connection with a computer or any instruction execution system. For the purposes of this description, a computer-usable or computer readable medium can be any tangible apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk—read only memory (CD-ROM), compact disk—read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

The description of the illustrative embodiments have been presented for purposes of illustration and description, and is not intended to be exhaustive or limited to the illustrative embodiments in the form disclosed. Many modifications and variations will be apparent to those of ordinary skill in the art. The embodiment was chosen and described in order to best explain the principles of the illustrative embodiments, the practical application, and to enable others of ordinary skill in the art to understand the illustrative embodiments for various embodiments with various modifications as are suited to the particular use contemplated.

What is claimed is:

1. A computer implemented method for burn-in testing of a multiprocessor, the method comprising:
    identifying a power management data set for a plurality of processor cores associated with the multiprocessor;
    selecting a set of processor cores based upon the power management data set, wherein the set of processor cores comprises at least one processor core selected from the plurality of processor cores;
    initiating a burn-in test across the selected set of processor cores; and
    responsive to a determination that all the processor cores in the plurality of processor cores have not been selected, repeating the above selecting and initiating steps.

2. The computer implemented method of claim 1, wherein the selecting step further comprises:
    analyzing the power management data set to determine a power usage for each processor core in the plurality of processor cores; and
    selecting the set of processor cores based on an average power usage for the set of processor cores.

3. The computer implemented method of claim 2, wherein the selecting step further comprises:
    selecting a set of processor cores with an average power usage that will provide a uniform power distribution during the burn-in testing.

4. The computer implemented method of claim 1, wherein the identifying step further comprises:
    performing a wafer test to determine power management data for each processor core to form the set of power management data.

5. The computer implemented method of claim 4, wherein power management data for a processor core includes at least one of an operational power usage, a standby power usage, a thermal capacity, a thermal limit, and an execution speed for the processor core.

6. The computer implemented method of claim 1, wherein the initiating step further comprises:

associating a voltage pin with each processor core in the plurality of processor cores, wherein each voltage pin associated with a processor core in the selected set of processor cores forms a set of voltage pins; and applying a first voltage across at least one voltage pin in the set of voltage pins.

7. The computer implemented method of claim 6 further comprising:

applying a second voltage across at least one voltage pin in the set of voltage pins, wherein the second voltage is different from the first voltage.

8. The computer implemented method of claim 1, wherein the initiating step further comprises:

controlling a voltage applied to the selected set of processor cores by a set of voltage offset networks associated with the selected set of processor cores.

9. The computer implemented method of claim 1, wherein the multiprocessor is heterogeneous.

\* \* \* \* \*